United States Patent [19]

Hayakawa

[11] Patent Number: 5,006,907
[45] Date of Patent: Apr. 9, 1991

[54] CROSSTALK PREVENTING LASER DIODE ARRAY

[75] Inventor: Toshiro Hayakawa, Tokyo, Japan

[73] Assignee: Eastman Kodak Company, Rochester, N.Y.

[21] Appl. No.: 465,697

[22] Filed: Jan. 16, 1990

[30] Foreign Application Priority Data

Jun. 23, 1989 [JP] Japan .................................. 1-161792

[51] Int. Cl.⁵ ..................... H01L 33/00; H01L 27/12; H01L 29/161; H01S 3/19
[52] U.S. Cl. ......................................... 357/17; 357/4; 357/16; 372/45
[58] Field of Search .................... 357/17, 4; 372/45

[56] References Cited

U.S. PATENT DOCUMENTS

| | | | |
|---|---|---|---|
| 4,296,425 | 10/1981 | Nishizawa | 357/17 |
| 4,354,140 | 10/1982 | Nishizawa | 313/499 |
| 4,414,558 | 11/1983 | Nishizawa et al. | 357/17 |
| 4,788,688 | 11/1988 | Hasenberg et al. | 372/45 |
| 4,819,048 | 4/1989 | Mand et al. | 357/17 |
| 4,852,111 | 7/1989 | Hayakawa et al. | 372/46 |
| 4,857,971 | 8/1989 | Burnham | 357/4 |
| 4,868,614 | 9/1989 | Yamazaki | 357/17 |
| 4,890,293 | 12/1989 | Taneya et al. | 372/45 |
| 4,893,313 | 1/1990 | Hatakoshi et al. | 357/17 |
| 4,894,836 | 1/1990 | Hayakawa et al. | 372/45 |
| 4,896,328 | 1/1990 | Sekiguchi et al. | 372/45 |
| 4,901,326 | 2/1990 | Hayakawa et al. | 372/45 |
| 4,905,058 | 2/1990 | Yamada et al. | 357/17 |
| 4,905,246 | 2/1990 | Hayakawa et al. | 357/17 |
| 4,910,743 | 3/1990 | Ohba et al. | 372/45 |
| 4,918,496 | 4/1990 | Matsushima | 357/17 |
| 4,933,728 | 6/1990 | Fukuzawa et al. | 372/45 |
| 4,941,146 | 7/1990 | Kobayashi | 372/45 |

Primary Examiner—Andrew J. James
Assistant Examiner—Cynthia S. Deal
Attorney, Agent, or Firm—Raymond L. Owens

[57] ABSTRACT

A heterojunction type light-emitting diode array in which a carrier barrier layer is provided on the emission layer to prevent the diffusion of carriers injected from the junction side of the component light-emitting diodes. An absorption layer is provided on the carrier barrier, which also connects the light-emitting diodes, suppressing crosstalk between adjacent light-emitting elements. The array thus configured provides good emission efficiency and high uniformity.

4 Claims, 3 Drawing Sheets

CROSSTALK PREVENTING LASER DIODE ARRAY

BACKGROUND OF THE INVENTION

1. Field of the Invention

This invention relates to a light-emitting diode array, and more particularly to a heterojunction light-emitting diode array having a multiplicity of light-emitting diodes closely arrayed on a single substrate.

2. Description of the Prior Art

A light-emitting diode (LED) array consists of multiple p-n or p-i-n junction LEDs fabricated in a single substrate. An advantage of a light-emitting diode array is that it can be used to process image information with relative ease, by electrically controlling the discrete diodes. Because of this, light-emitting diode arrays are being improved and applied in a variety of ways.

With the increasing importance of electronic information in today's world, printers need to be able to print faster and at higher densities in order to cope not only with the growing amounts of information, but also with the inclusion of image information in the form of graphs, drawings, photographs and the like. One way of achieving this is to use light-emitting diode arrays as the light sources in printers.

Laser printers, which employ a laser light source, and LED printers, which employ a LED array as the light source, are two examples of non-impact optical printers. A laser printer requires the use of a mechanical mechanism such as a rotating polygonal mirror for scanning laser beam, and a correspondingly complex optical system. An LED printer, on the other hand, only requires a drive system for electrically controlling the discrete diodes (hereinafter also referred to as light-emitting elements) that make up the light-emitting diode array. As an LED printer is therefore structurally simple and straightforward, requiring no mechanical moving parts, using instead an optically magnifying lens array, it is possible for LED printers to be smaller, faster and more reliable than laser printers.

FIG. 5 is a cross-sectional illustration of a conventional homojunction type LED array used in an LED printer. For simplicity only two light-emitting elements are shown. With reference to the figure, each light-emitting element is formed by the use of vapor-phase epitaxy (VPE) to deposit an n-GaAsP layer 414 (about 50 microns thick) on an n-GaAs substrate 110, followed by a SiN masking layer 18 and a diffusion of Zn to form Zn diffused regions 420 (each about 1.5 microns thick). The light-emitting element is formed by the p-n junction at the interface between the n-GaAsp layer 414 and the Zn diffused regions 420.

p-Electrodes 22 and an n-electrode 24 are then formed, followed by the application of an antireflection SiN layer 426. The SiN layer 426 is then removed from the non-light-emitting element portions to form a p-electrode 22 bonding pad.

The light-emitting diode array thus formed contains numerous lattice defects due to a lack of lattice matching between the GaAsP layer 414 used as the light-emitting material and the GaAs substrate 110. As a result there is considerable non-uniformity of the material itself, so the emission efficiency is low. In addition, because the p-n junction is a homojunction having a low injection efficiency, it is difficult to improve the emission efficiency.

The AlGaAs single heterojunction type light-emitting diode array shown in FIG. 6 was developed previously.

With reference to FIG. 6, liquid-phase epitaxy (LPE) is used to form a p-$Al_{0.2}Ga_{0.8}As$ layer 514, an n-$Al_{0.5}Ga_{0.5}As$ layer 520 and an $n^+$-GaAs layer 521 on a p-GaAs substrate 310. n-Electrodes 322 and a p-electrode 324 are then formed by deposition, and the unnecessary portions of the n-electrode 322 are removed using photo-lithography and plasma etching.

A chemical process is then used to selectively etch the $n^+$-GaAs layer 521. Photolithography and chemical etching are then used on the non-light-emitting region to form the n-AlGaAs layer 520 penetrating about 1 micron into the p-AlGaAs layer 514. Plasma CVD is then used to form an antireflection SiN layer 426, followed by the use of heat treatment to form ohmic contacts for the n-electrode 322 and p-electrode 324, thereby completing the fabrication of the heterojunction light-emitting diode array.

Structurally, this type of heterojunction light-emitting diode array consists of conventional individual high-luminance LEDs arranged into a single array. The use of a heterojunction provides an improvement in the injection efficiency, and by using an n-AlGaAs layer 520 which is transparent to the 720 nm light emitted by the light-emitting p-AlGaAs layer 514, energy attenuation caused by internal absorption is avoided, enabling an emission efficiency to be achieved that is several times higher than that achievable with the light-emitting diode array shown in FIG. 5.

However, there are a number of problems with the above-described LED arrays. As is known, unlike when single discrete LEDs are involved, in an array of LEDs consisting of a multiplicity of light-emitting elements closely arranged on a single substrate, it is important to achieve reduced optical crosstalk between light-emitting elements to prevent deterioration of characteristics caused by reflection or diffusion between the elements of adjacent light-emitting elements or at the edge portions of the SiN dielectric layer.

As described above, conventional heterojunction type light-emitting diode arrays use the n-AlGaAs layer 520 as a transparent window to raise the emission efficiency. It therefore follows that reducing the crosstalk between adjacent elements requires the use of an etching process for complete removal of the n-AlGaAs layer 520 between elements. Also, to reduce optical bleeding, non-mesa portions of the emission layer have to be etched to a certain minimum depth.

It is known that the diffusion length of minority carrier electrons injected into the emission layer from the heterojunction is in the order of 10 microns. Therefore the emission layer has to be etched to at least 10 microns in order to reduce optical bleeding and attain optimum emission efficiency, but because of the difficulty of obtaining uniform etching with good reproducibility, the result has been a tendency towards a deterioration in device characteristics.

One solution, which is employed in the case of discrete LEDs, is to incorporate a double heterostructure by providing an AlGaAs layer with a high Al ratio below the AlGaAs emission layer. However, as mentioned above, when the arrangement is an array constituted of a multiplicity of light-emitting diodes consideration must be given to the possibility of crosstalk occurring between adjacent light-emitting elements. As such, deep etching is required to isolate the AlGaAs window layer, and the large increase in non-uniformity this produces because a problem.

SUMMARY OF THE INVENTION

An object of the present invention is therefore to provide a heterojunction type LED array that has a high emission efficiency and high uniformity.

This object is achieved in a heterojunction light-emitting diode array in which carriers are injected into the heterojunction surface of the emission layer of each diode of the array, comprising: a thin carrier barrier layer having a thickness less than 0.1 micron and placed on the emission layer surface opposite to the heterojunction side surface, with the carrier barrier layer having a wider energy gap than that of the emission layer to prevent the diffusion of carriers injected into the emission layer from the heterojunction side; and an absorption layer which connects each diode and being displaced on the surface of the carrier barrier layer opposite to the side having the interface between the carrier barrier layer and the emission layer, with the absorption layer having an energy gap that is the same as or narrower than the energy gap of the emission layer and supresses crosstalk between adjacent light-emitting diodes.

With the light-emitting diode array thus configured in accordance with the present invention, minority carriers injected from the junction side will be confined in the emission layer by the carrier barrier layer with the wider energy gap, thereby enabling the effective emission region in the emission layer to be made smaller and the emission layer thinner. The reduction of internal absorption by the emission layer also enables emission efficiency to be raised.

As the thickness of 0.1 micron or less specified for the carrier barrier layer is less than the wavelength of the light, the layer will not act as a waveguide between adjacent light-emitting elements. In addition, the provision of an optical absorption layer on the other surface of the carrier barrier layer can be used to suppress optical crosstalk between adjacent light-emitting elements. This structure facilitates the elimination of the need for deep etching during the formation of the light-emitting mesa regions and enables a high uniformity to be obtained.

BRIEF DESCRIPTION OF THE DRAWINGS

The objects and features of the present invention will become more apparent from the following detailed description taken in conjunction with the accompanying drawings in which.

DETAILED DESCRIPTION OF THE INVENTION

Figure 1:
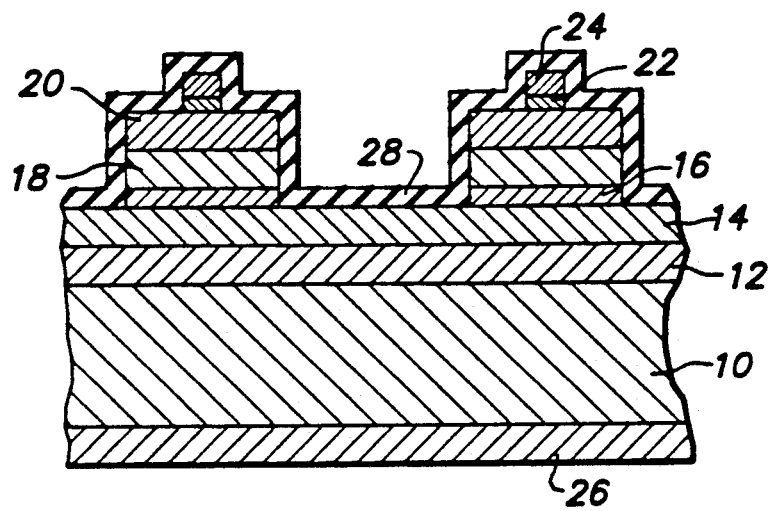
FIG. 1 is a cross-sectional view of a first embodiment of a light-emitting diode array according to the present invention.

FIG. 1 is a cross-sectional view of an AlGaAs system light-emitting diode array according to a first embodiment of the present invention. For simplification only two light-emitting elements are shown.

With reference to the drawing, molecular beam epitaxy (MBE) is used to form a p-GaAs buffer layer 12 (0.2 micron thick; $Be = 1 \times 10^{18}$ cm$^{-3}$) on a p-GaAs substrate 10 ($Zn = 1 \times 10^{18}$ cm$^{-3}$), followed by a AlGaAs absorption layer 14 (0.5 micron thick; $Be = 8 \times 10^{17}$ cm$^{-3}$), a p-AlAs carrier barrier thin layer 16 (0.03 micron thick; $Be = 5 \times 10^{18}$ cm$^{-3}$), a p-Al$_{0.3}$Ga$_{0.7}$As emission layer 18 (0.3 micron thick; $Be = 8 \times 10^{17}$ cm$^{-3}$), an n-Al$_{0.5}$Ga$_{0.5}$As window layer 20 (1.5 microns thick; $Si = 2 \times 10^{18}$ cm$^{-3}$) and an n$^+$-GaAs layer contact layer 22 (0.05 micron thick; $Si = 3 \times 10^{18}$ cm$^{-3}$). The wavelength of the light thus emitted is about 670 nm.

n-Electrodes 24 and p-electrodes 22 are then formed by deposition, and photolithography and plasma etching are used to remove non-essential portions of the p-electrode 26 and the n$^+$-GaAs layer contact layer 22 is then selectively chemically etched, leaving the n-electrode 24.

After then removing the photoresist used to form the n-electrode 24, photolithography and chemical etching are used to remove the epitaxially grown layers around the regions that form the light-emitting elements until the AlGaAs absorption layer 14 is reached, thereby forming mesa-shaped emission regions.

Next, plasma CVD is used to form an antireflection SiON coating 28 and heat treatment is used to form ohmic contacts for the n-electrode 24 and the p-electrodes 26.

With the light-emitting diode array fabricated by the above processes, minority carrier electrons injected from the heterojunction formed by the interface between the p-AlGaAs emission layer 18 and the n-AlGaAs window layer 20, being unable to diffuse in the p-AlAs carrier barrier thin layer 16, with its wide energy gap, are confined within the p-AlGaAs emission layer 18, making it possible to form an emission layer with a thickness of 0.3 microns, far thinner than conventional emission layers. Internal absorption by the emission layer is therefore reduced, improving emission efficiency and easing the etching step by reducing the required etching depth, i.e. the height of the emission mesas, thereby providing a light-emitting array with good uniformity.

Also, as the p-AlGaAs absorption layer 14 couples adjacent light-emitting elements, by setting the Al ratio of this layer lower than it is in the p-AlGaAs emission layer 18, light emitted by the layer 18 can be absorbed and crosstalk reduced.

Figure 2:
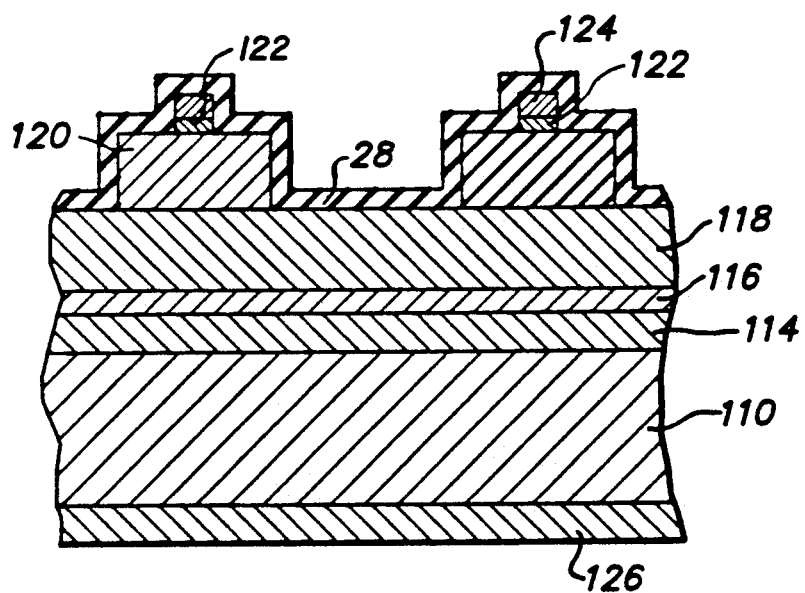
FIGS. 2, 3 and 4 are cross-sectional views of second, third and fourth embodiments, respectively, of the invention.

FIG. 2 is a cross-sectional view of an AlGaAs system light-emitting diode array according to a second embodiment of the invention. For simplicity only two light-emitting elements are illustrated.

With reference to the figure, metal organic chemical vapor deposition (MOCVD) is used to form an n-GaAs absorption layer 114 (0.4 micron thick; $Se = 1 \times 10^{18}$ cm$^{-3}$) on a n-GaAs substrate 110 ($Si = 2 \times 10^{18}$ cm$^{-3}$), followed by an n-AlAs carrier barrier layer 116 (0.04 micron thick; $Se = 8 \times 10^{17}$ cm$^{-3}$), an n-Al$_{0.2}$Ga$_{0.8}$As emission layer 118 (0.5 micron thick; $Se = 8 \times 10^{17}$ cm$^{-3}$), a p-Al$_{0.5}$Ga$_{0.5}$As window layer 120 (1.5 micron thick; $Zn = 8 \times 10^{18}$ cm$^{-3}$). The wavelength of the light thus emitted is about 720 nm.

n-Electrodes 124 and p-electrodes 126 are then formed by deposition, and photolithography and chemical etching are used to shape the p-electrodes and form the emission mesas. The same processes as those described in the first embodiment are then used to complete fabrication of the light-emitting diode array of this embodiment.

With the emission layer 118 of this embodiment is n-type, the minority carriers injected from the heterojunction are holes which, combined with the confinement effect of the carrier barrier 116, shortens the diffusion length. This enables mesas to be made lower and increases emission efficiency, and by also facilitating the etching process enables a light-emitting diode with good uniformity to be obtained.

Also, with the adjacent emission elements being coupled by the absorption layer 114, crosstalk is effectively suppressed.

Figure 3:
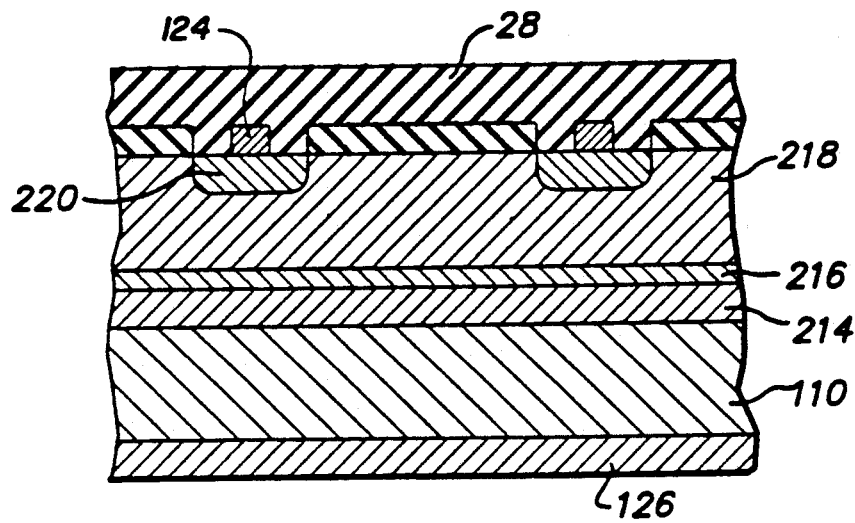

FIG. 3 is a cross-sectional view of a GaAs system light-emitting diode array according to a third embodiment of the present invention. For simplification only two light-emitting elements are shown.

With reference to the drawing, molecular beam epitaxy is used to form an n-GaAs absorption layer 214 (0.2 micron thick; $Si=1\times10^{18}$ cm$^{-3}$) on an n-GaAs substrate 110 ($Si=2\times10^{18}$ cm$^{-3}$), followed by an n-Al$_{0.3}$Ga$_{0.7}$As carrier barrier layer 216 (0.05 micron thick; $Si=8\times10^{17}$ cm$^{-3}$) and an undoped i-GaAs emission layer 218 (1.7 microns thick).

This is followed by the use of plasma CVD to form a SiN masking layer, and the diffusion of Zn (to a depth of 1.5 microns) to form p-diffused regions 220, thereby to form p-i-n junctions. The same processes as those described in the first embodiment are then used to complete fabrication of the light-emitting diode array of this embodiment.

Figure 5:
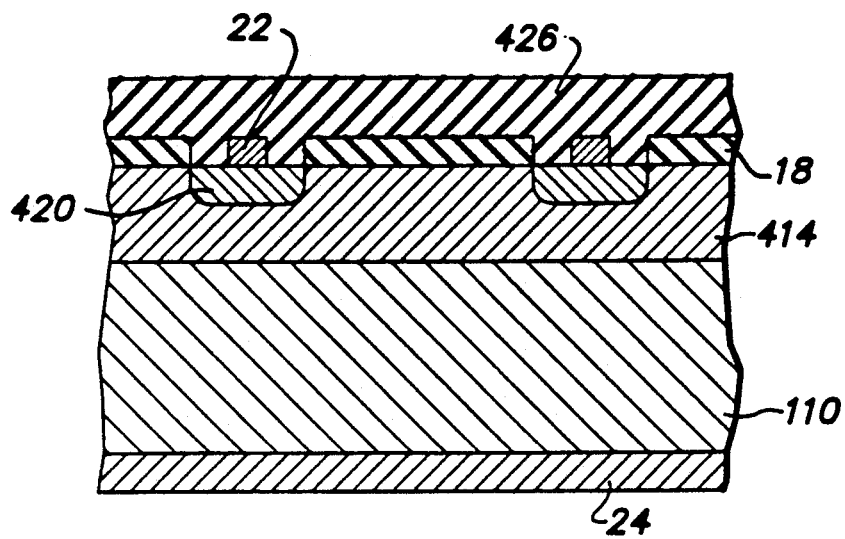
FIG. 5 is a cross-sectional view of a conventional homojunction light-emitting diode array.
Figure 6:
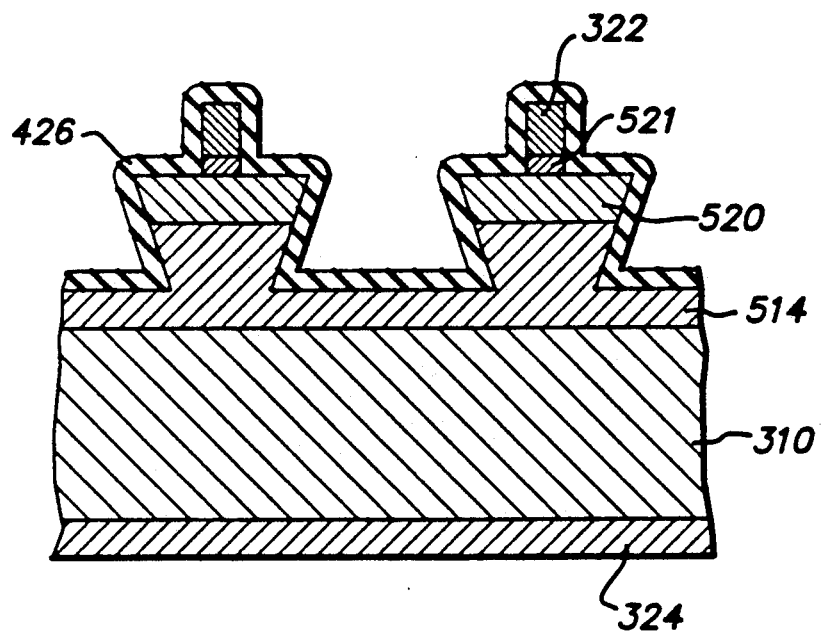
FIG. 6 is a cross-sectional view of a conventional heterojunction light-emitting diode array.

Unlike the first and second embodiments, in this embodiment there is no non-absorbing window layer. This means that the light extraction efficiency is lower, but because it is therefore possible, with the carrier barrier layer 216, to confine the minority holes injected from the junction side, it is possible to decrease the effective thickness of the emission layer 218 to 1.7 microns, which is much thinner than the emission layer illustrated in FIG. 5, thereby reducing internal absorption by the emission layer 218 and raising the output level of the device.

Figure 4:
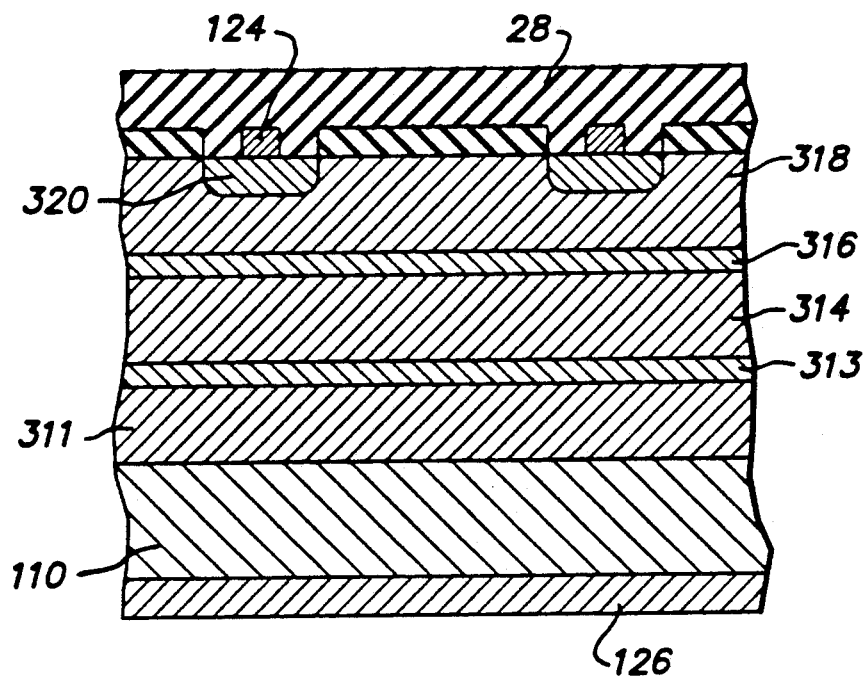

FIG. 4 is a cross-sectional view of a GaAsP system light-emitting diode array according to a fourth embodiment of the present invention. For simplification only two light-emitting elements are shown.

Gas source MBE (GSMBE) employing a group III metal and AsH$_3$ and PH$_3$ as a group V material is used to form an n-GaAsP graded buffer layer 311 (0.4 micron thick; $Si=1\times10^{18}$ cm$^{-3}$) on an n-GaAs substrate 110 ($Si=2\times10^{18}$ cm$^{-3}$), followed by an n-superlattice buffer layer 313 ($Si=1\times10^{18}$ cm$^{-3}$), an n-GaAs$_{0.6}$P$_{0.4}$ absorption layer 314 (1.0 microns thick; $Si=1\times10^{18}$ cm$^{-3}$) an n-(Al$_{0.7}$Ga$_{0.3}$)$_{0.71}$In$_{0.29}$P carrier barrier layer 316 (0.02 micron thick; $Si=1\times10^{18}$ cm$^{-3}$) and an n-GaAs$_{0.6}$P$_{0.4}$ emission layer 318 (3.0 microns thick; $Si=1\times10^{18}$ cm$^{-3}$). Here, the n-superlattice buffer layer 313 consists of 10 alternations of a 30 Å thin layer of n-GaAs with a 50 Å thin layer of n-GaAs$_{0.6}$P$_{0.4}$; the wavelength of the light thus emitted is about 655 nm. The same processes as those described in the third embodiment are then used to complete fabrication of the light-emitting diode array of this embodiment.

Because in this embodiment the layer of GaAsP used as the emission material has a lattice structure that does not match that of the GaAs substrate 110, the graded buffer layer 311 and the superlattice buffer layer 313 are used to enhance the crystal compatibility. Similarly to the third embodiment, the emission layer, at 3 microns, is thinner than previous emission layers, which enables the output level of the device to be raised.

The foregoing description of each embodiment has been made with reference to specific layer thicknesses and compositions such as AlGaAs, GaAsP and GaAs. However, it is to be understood that the present invention is not limited thereto but that, instead, other layer thicknesses and semiconductor material compositions may be used such as, for example, GaInAsP, GaAlInP, AlGaInAs and AlGaAsSb.

Also, although in the embodiments MBE, MOCVD and GSMBE were used to form the semiconductive layers on the substrates, the light-emitting diode array according to this invention may also be fabricated using other epitaxial techniques such as chemical beam epitaxy (CBE) employing an organometallic gas on a group III material.

Although the embodiments were described in terms of a single emission layer, multi-layer superlattice structures or quantum well structures may also be employed to achieve the same effect.

As described in the foregoing, in accordance with this invention a high efficiency light-emitting diode array can be obtained that has good uniformity and low crosstalk between adjacent light-emitting elements.

The invention has been described in detail with particular reference to certain preferred embodiments thereof, but it will be understood that variations and modifications can be effected within the spirit and scope of the invention.

I claim:

1. In a light-emitting diode array in which in each light-emitting diode carriers are injected from a window layer into the surface of a light emission layer, a diode junction being formed between the window layer and emission layers, comprising:
   a thin carrier barrier layer having a thickness less than 0.1 micron and placed on the emission layer surface opposite to the junction side surface, with the carrier barrier layer having a wider energy gap than that of the emission layer to prevent the diffusion of carriers injected into the emission layer from the heterojunction side; and
   a light absorption layer which connects each diode and being displaced on the surface of the carrier barrier layer opposite to the side having the interface between the carrier barrier layer and the emission layer, with the absorption layer having an energy gap that is the same as or narrower than the energy gap of the emission layer and suppresses crosstalk between adjacent light-emitting diodes.

2. The array as set forth in claim 1 wherein the emission, barrier and absorption layers are p-type and the window layer is n-type.

3. The array as set forth in claim 1 wherein the emission, barrier and absorption layers are n-type and the window layer is p-type.

4. The array as set forth in claim 1 wherein the emission layer is an undoped intrinsic layer and the barrier and absorption layers are the same conductivity type and the window layer is p-type.

* * * * *